Nov. 30, 1954

M. SPARKS

FABRICATION OF SEMICONDUCTORS FOR
SIGNAL TRANSLATING DEVICES

Filed Feb. 15, 1952

2,695,852

INVENTOR
M. SPARKS

BY

ATTORNEY

United States Patent Office 2,695,852 Patented Nov. 30, 1954

2,695,852

FABRICATION OF SEMICONDUCTORS FOR SIGNAL TRANSLATING DEVICES

Morgan Sparks, Basking Ridge, N. J., assignor to Bell Telephone Laboratories, Incorporated, New York, N. Y., a corporation of New York Application February 15, 1952, Serial No. 271,712

4 Claims. (Cl. 117—106)

Figure 1:
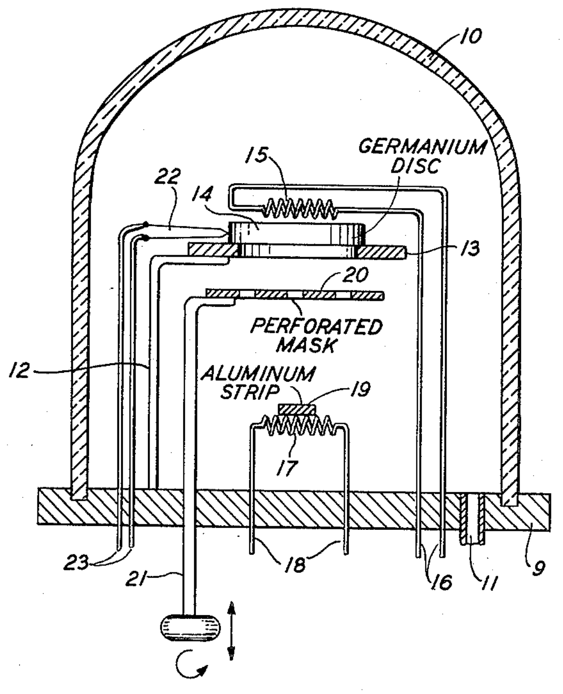

This invention relates to the fabrication of semiconductor bodies for signal translating devices and more particularly to methods for producing such bodies having PN junctions therein.

Junctions of this type, as is now known, are defined by a pair of contiguous zones of semiconductive material, such as germanium or silicon, of opposite conductivity types. Semiconductive bodies including PN junctions find application in a variety of signal translating devices, for example in rectifiers such as disclosed in Patent 2,402,661, granted June 25, 1946, to R. S. Ohl and the application Serial No. 638,351, filed December 29, 1945, now Patent 2,602,211, granted July 8, 1952, of J. H. Scaff and H. C. Theuerer, in photosensitive devices such as disclosed in Patent 2,402,662, granted June 25, 1946, to R. S. Ohl and in the application above referred to, and in transistors, such as disclosed in Patents 2,502,488 and 2,569,347, granted April 4, 1950 and September 25, 1951, respectively, to W. Shockley.

It has been suggested heretofore that PN junctions may be produced by diffusion of a suitable impurity into a semiconductive body, for example by diffusing an impurity of the class known as acceptors into a body of N conductivity type thereby to convert a portion or zone of the body to P conductivity type. Illustrative diffusion methods are disclosed in the application Serial No. 136,038, filed December 30, 1949, of W. G. Pfann and H. C. Theuerer. In the priorly suggested methods, however, heating of the semiconductive body for extended periods, for example of the order of fifteen hours, was involved to effect the diffusion of the acceptor into the semiconductor. Further, it has been found that, particularly in the case of use of aluminum as the acceptor, difficulty is encountered in effecting the diffusion and in obtaining junctions of uniform and reproducible physical and electrical characteristics.

One general object of this invention is to improve the production of PN junctions in semiconductor bodies for signal translating devices. More specifically objects of this invention are to facilitate the fabrication of such junctions, to reduce the time requisite to effect desired diffusion or alloying of prescribed impurities into or with semiconductive bodies whereby to effect an inversion in the conductivity type of portions or zones of the bodies, and to enable the formation of junctions of uniform and reproducible characteristics.

In one illustrative embodiment of this invention, a PN junction is produced by diffusing an acceptor, for example aluminum, into a body of N-type germanium or silicon.

In accordance with one feature of this invention, the acceptor is vapor deposited, in vacuum or an inert atmosphere, upon the semiconductive body while the body is maintained at a temperature above the melting point of the acceptor-semiconductor eutectic. For example, in one specific embodiment, aluminum is deposited in vacuum upon an N-type germanium body while the latter is maintained at a temperature of about 500° C. Under these conditions, the aluminum diffuses readily into the germanium and a PN junction is formed in a matter of a few minutes. Also contamination of the aluminum is prevented whereby uniform diffusion over a prescribed portion of the germanium element is realized and a physically and electrically uniform NP junction is obtained.

The deposition of the acceptor, such as aluminum, may be done through a mask adjacent the semiconductor thereby to produce one or more P-type zones of prescribed extent in the N-type body. For example, the acceptor may be deposited upon two restricted closely adjacent areas of one face of the body whereby a PNP germanium element utilizable in transistors of the type disclosed in the Patent 2,569,347 heretofore mentioned is produced.

It will be understood that other significant impurities, both acceptors and donors, may be used in practicing the methods of this invention. Illustrative acceptors, in addition to aluminum, are gallium and indium; illustrative donors are antimony and arsenic.

Figure 2:
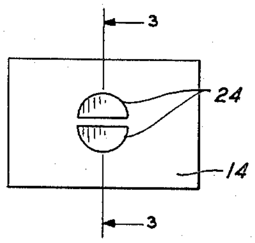
Figure 3:
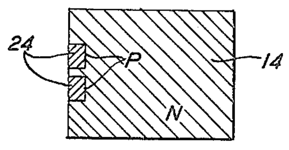

The invention and the above noted and other features thereof will be understood more clearly and fully from the following detailed description with reference to the accompanying drawing in which:

Fig. 1 is a diagram depicting apparatus which may be employed in practicing the methods in accordance with this invention; and Figs. 2 and 3 are plan and sectional views respectively of an illustrative semiconductive body constructed in accordance with this invention and particularly suitable for use in junction transistors.

Referring now to this drawing, the apparatus illustrated in Fig. 1 comprises a base 9 mounting a bell jar 10, the base 9 having therein a port 11 by way of which the bell jar may be evacuated or an inert gas, for example helium, may be introduced into the bell jar 10. Affixed to the base 9 are a plurality of supports 12 which mount an apertured platform or plate 13 upon which a semiconductive element 14, for example a disc or wafer of germanium or silicon, is seated. The semiconductive element 14 may be heated and maintained at a desired or prescribed temperature by a heater element 15 in juxtaposition thereto, the heater element being connected to terminals 16 for association with an appropriate energizing source.

Opposite the aperture in the plate or platform 13 is a second filament 17, for example of tungsten, having terminals 18 for association with a suitable energizing source. The filament 17 carries a quantity of an appropriate impurity, donor or acceptor, for example an aluminum strip 19.

Disposed intermediate the filament 17 and the semiconductive element 14 is an apertured mask 20 which is mounted by a longitudinally and rotatably adjustable support 21 extending through the base 9. The aperture or apertures in the mask 20 may be of any desired configuration determined by the pattern of the desired area of the lower face of the element 14 over which it is desired to deposit the impurity material 19.

The temperature of the semiconductive element may be determined as by a thermocouple 22 connected to terminals 23 for association with an indicating device, not shown.

In use of the apparatus illustrated in Fig. 1, the bell jar is evacuated or an inert gas, such as helium, is introduced thereinto by way of the port 11. The heater element 15 is energized to raise the semiconductive element to the prescribed temperature and to maintain it at this temperature. Also the filament 17 is energized to effect vaporization of the impurity material. The vaporized material passes through the mask 20 and deposits upon the lower surface, in Fig. 1 of the semiconductive element 14, the area of deposition being determined by the configuration of the aperture or apertures in the mask 20.

The deposited material diffuses into the heated semiconductive element, thereby to alter the conductivity type of a zone or zones in the body 14.

Following the deposition of the impurity material, the body 14 is removed from the bell jar and the surface thereof etched lightly, for example with an etchant composed of one part 48 per cent HF, one part 30 per cent $H_2O_2$ and four parts water.

In a specific embodiment, a PN junction in germanium was produced in the following manner: a disc shaped wafer 14 of N-type germanium having a resistivity of about 10 ohm centimeter and about one centimeter in diameter and 0.07 centimeter thick was mounted as illustrated in Fig. 1, heated to about 500° C. through the heater element 19 and maintained at that temperature. The bell jar 10 was highly evacuated. Pure aluminum foil was mounted on the filament and vaporized thereby, whereby aluminum was vapor deposited upon the lower face (in Fig. 1) of the germanium wafer. The mask had therein a circular aperture, 0.10 inch in diameter, across one diameter of which a 0.01 inch tantalum wire extended, so that the aluminum was deposited over areas of the configuration depicted at 24 in Fig. 2.

The germanium element was then cooled to room temperature and etched in the solution described above. Following this a substantially ohmic connection was made to the face of the wafer opposite that on which the aluminum had deposited and the unit was operated as a transistor with one of the P zones 24 in Fig. 3 utilized as the emitter connection, the other P zone as the collector connection, and the ohmic connection as the base. Power gains of about 6 decibels were realized.

In the embodiment described, the aluminum was evaporated in a few seconds, and the germanium target was maintained hot for about ten minutes after the evaporation. Aluminum is difficult to evaporate. For other elements with higher vapor pressure it is possible to evaporate slowly over any desired period of time, especially if the evaporation is done from a graphite crucible heated by induction.

When the fabrication is performed as described the alloying occurs at the aluminum-germanium interface where actual melting occurs since the temperature is above the melting point of the eutectic. This is rapid compared with diffusion of aluminum atoms into the solid germanium lattice. However, both of these mechanisms result in producing the desired P-type aluminum germanium alloy.

It will be noted that during the vapor deposition the germanium wafer is maintained at a temperature above the melting point, about 425° C., of germanium-aluminum eutectic. This has been found particularly advantageous as enhancing the diffusion of the acceptor into the germanium. Also it will be appreciated that the fabrication of the junction is effected in a very short period of time. Further, the vapor deposition of the aluminum under vacuum and upon a heated semiconductor assures deposition of essentially pure aluminum upon the germanium, intimate contact between aluminum and germanium over the entire area of deposition and the production of a physcially and electrically uniform and continuous PN junction. The method, thus, enables and facilitates the economic fabrication of junctions of desirable and reproducible physical and performance characteristics.

An illustrative construction of semiconductive bodies fabricated in accordance with this invention is shown in Figs. 2 and 3. For this case the mask 20 had therein a single circular aperture over which a thin wire, for example of tungsten, extended and the material 19 was aluminum. As illustrated in Fig. 2, the aluminum was deposited upon two substantially semicircular closely adjacent areas on one face of the body 14, the spacing between the two semi-circular areas being substantially 0.1 inch. Adjacent the areas indicated at 24 in Figs. 2 and 3 and as shown more clearly in Fig. 3 the aluminum diffused into the body 14 thereby to form two P conductivity type zones 24 in the N-type body 14. These zones may be operated as the emitter and collector portions of a PNP transistor in the manner disclosed in the Shockley Patent 2,569,347, referred to hereinabove.

Although the invention has been described with particular reference to the production of PN junctions in germanium through the use of aluminum, it may be practiced also with other semiconductors, for example silicon, and other significant impurities, that is donors and acceptors, a number of which have been mentioned hereinabove. Also, it will be understood that various modifications may be made in the specific embodiments disclosed without departing from the scope and spirit of this invention.

What is claimed is:

1. The method of fabricating a semiconductive element for signal translating devices which comprises vapor depositing a material selected from the group consisting of acceptors and donors upon a boly of semiconductive material selected from the group consisting of germanium and silicon, in an inert atmosphere and while maintaining said body at a temperature above the melting point of the semiconductor-impurity eutectic and below the melting point of the semiconductive material.

2. The method of fabricating a semiconductive element for signal translating devices which comprises mounting an N-type semiconductive body selected from the group consisting of germanium and silicon, in a chamber, maintaining an inert atmosphere in said chamber, vapor depositing an acceptor upon said body, and maintaining said body at a temperature above the melting point of the semiconductor-acceptor eutectic and below the melting point of the semiconductor, during the vapor deposition of said acceptor.

3. The method of fabricating a germanium element having a PN junction therein which comprises vapor depositing an acceptor upon an N-type germanium body, in vacuum and while maintaining said body at a temperature above the melting point of the germanium-acceptor eutectic and below the melting point of germanium.

4. The method of producing a germanium PN junction which comprises vapor depositing aluminum upon an N-type body of germanium, in vacuum and while maintaining said body at a temperature of about 500° C.

References Cited in the file of this patent

UNITED STATES PATENTS

| Number | Name | Date |
|---|---|---|
| 2,151,457 | Williams | Mar. 21, 1939 |
| 2,552,626 | Fisher et al. | May 15, 1951 |
| 2,556,771 | Teal | June 12, 1951 |